US006744635B2

(12) United States Patent
Portman et al.

(10) Patent No.: US 6,744,635 B2
(45) Date of Patent: Jun. 1, 2004

(54) REMOVABLE VISUAL INDICATION STRUCTURE FOR A PRINTED CIRCUIT BOARD

(75) Inventors: Roland F. Portman, Pleasanton, CA (US); Edgar Jhay Gregorios, Tracy, CA (US)

(73) Assignee: Bit Microsystems, Inc., Fremont, CA (US)

( * ) Notice: Subject to any disclaimer, the term of this patent is extended or adjusted under 35 U.S.C. 154(b) by 0 days.

(21) Appl. No.: 09/504,304

(22) Filed: Feb. 15, 2000

(65) Prior Publication Data

US 2003/0128531 A1 Jul. 10, 2003

(51) Int. Cl.[7] .................................................. H05K 7/10
(52) U.S. Cl. ...................................... 361/760; 439/613
(58) Field of Search ................................ 439/611, 613, 439/480, 56, 57, 58; 361/806, 820; 257/89, 90; 340/458; 362/555

(56) References Cited

U.S. PATENT DOCUMENTS

| | | | | | |
|---|---|---|---|---|---|
| 3,909,096 A | * | 9/1975 | Brzozowski | ................ | 339/17 |
| 4,065,198 A | * | 12/1977 | Jordan | ........................ | 339/17 |
| 4,200,347 A | * | 4/1980 | Sinclair et al. | ............... | 439/70 |
| 4,338,717 A | * | 7/1982 | Damon | ........................ | 29/839 |
| 4,583,807 A | * | 4/1986 | Kaufman | .................... | 339/125 |
| 4,667,270 A | * | 5/1987 | Yagi | ............................ | 361/380 |
| 4,727,648 A | * | 3/1988 | Savage, Jr. | .................. | 29/839 |
| 5,396,086 A | * | 3/1995 | Engels et al. | ................. | 257/99 |
| 5,612,855 A | * | 3/1997 | Heeb et al. | ................. | 361/773 |
| 5,947,588 A | * | 9/1999 | Huang | ....................... | 362/235 |

* cited by examiner

Primary Examiner—David Martin
Assistant Examiner—Thanh S. Phan
(74) Attorney, Agent, or Firm—Sawyer Law Group LLP

(57) ABSTRACT

In a first aspect, a removable visual indication structure is disclosed. The removable visual indication structure includes a removable connection portion and a visual indication portion coupled to the removable connection portion wherein the visual indication structure can be removably attached to a printed circuit board. In a second aspect, a printed circuit board system is disclosed. The system includes a printed circuit board, at least one pin coupled to the printed circuit board, and at least one removable visual indication structure coupled to the at least one pin. In yet a third aspect, a method for fabricating a removable visual indication structure is disclosed. The method includes providing at least one visual indicator, providing a removable connector adapted to be coupled to the printed circuit board, and coupling the at least one visual indicator to the removable connector. Accordingly, the method and system provides a simple and cost effective way for manufacturers to provide visual indicators to various types of systems while at the same time increasing the amount of space available on the printed circuit board.

30 Claims, 4 Drawing Sheets

REMOVABLE VISUAL INDICATION STRUCTURE FOR A PRINTED CIRCUIT BOARD

CROSS REFERENCE TO RELATED APPLICATIONS

The present application is related to co-pending application Ser. No. (JAS 1318P), entitled "Printed Circuit Board Assembly" filed on the same day and assigned to the same Assignee as the present application.

FIELD OF THE INVENTION

The present invention relates generally to printed circuit board assemblies and more particularly to a removable visual indication structure for a printed circuit board.

BACKGROUND OF THE INVENTION

Computer systems continually require more functionality, more memory and faster operational speeds, and in many cases they need these features in smaller physical packages. To meet these requirements, the packaging density of the printed circuit board (PCB) assemblies of those computer systems increases accordingly. Therefore printed circuit board space must be efficiently utilized.

The PCB assemblies employed by these computer systems generally include a controller board that incorporates light emitting diodes (LEDs). These LEDs act as visual indicators to notify a computer user when certain components of the computer system are operating (i.e., when the system bus is active, when the processor is active, etc.).

FIG. 1 shows a typical printed circuit controller board 10. The printed circuit controller board 10 includes LEDs 12 and a plurality of header pins 14. The LEDs act as visual indicators for the board 10 and are permanently attached thereto. The plurality of header pins 14 are provided as a connection means for manufacturers to remotely place additional LEDs. Manufacturers can accordingly utilize flat ribbon cable or similar means to remotely place additional LEDs when incorporating the board 10 with their computer systems. FIG. 2 shows a typical flat ribbon cable connector 16. However, once a manufacturer remotely places the additional LEDs, the permanently attached LEDs are no longer needed. Thus, the printed circuit board space being utilized by the permanently attached LEDs is ultimately wasted.

Consequently, what is needed is a visual indication system that increases the amount of space available on the printed circuit board. The present invention addresses such a need.

SUMMARY OF THE INVENTION

In a first aspect of the present invention, a removable visual indication structure is disclosed. The removable visual indication structure in accordance with the present invention comprises a removable connection portion and a visual indication portion coupled to the removable connection portion wherein the visual indication structure can be removably attached to a printed circuit board.

In a second aspect of the present invention, a printed circuit board system is disclosed. The system in accordance with the present invention comprises a printed circuit board, at least one pin coupled to the printed circuit board, and at least one removable visual indication structure coupled to the at least one pin.

In yet a third aspect of the present invention, a method for fabricating a removable visual indication structure is disclosed. The method in accordance with the present invention comprises the steps of providing at least one visual indicator, providing a removable connector adapted to be coupled to the printed circuit board, and coupling the at least one visual indicator to the removable connector.

Accordingly, the present invention provides a simple and cost effective way for manufacturers to provide visual indicators to various types of systems while at the same time increasing the amount of space available on the printed circuit board.

DETAILED DESCRIPTION

The present invention relates to a removable visual indication structure for a printed circuit board. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is disclosed in the context of a preferred embodiment. The preferred embodiment of the present invention provides a removable visual indication structure for a printed circuit board. Accordingly, the present invention provides a simple and cost effective way for manufacturers to provide visual indicators to various types of systems while at the same time increasing the amount of space available on the printed circuit board.

Figure 2:
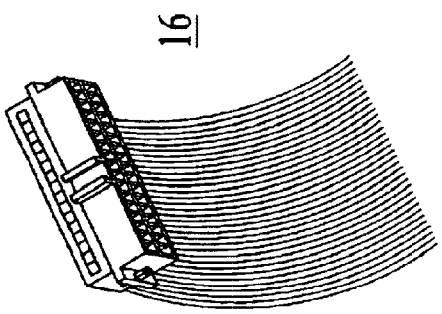
FIG. 2 shows a typical flat ribbon cable connector.
Figure 1:
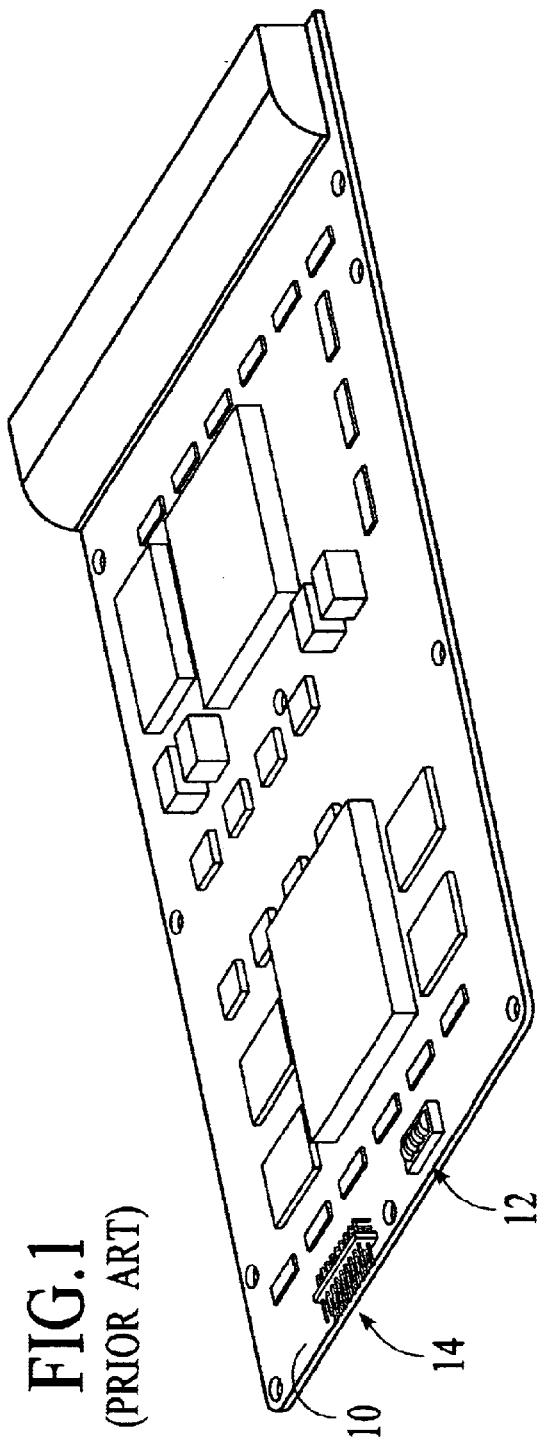
FIG. 1 shows the typical printed circuit controller board.
Figure 3:
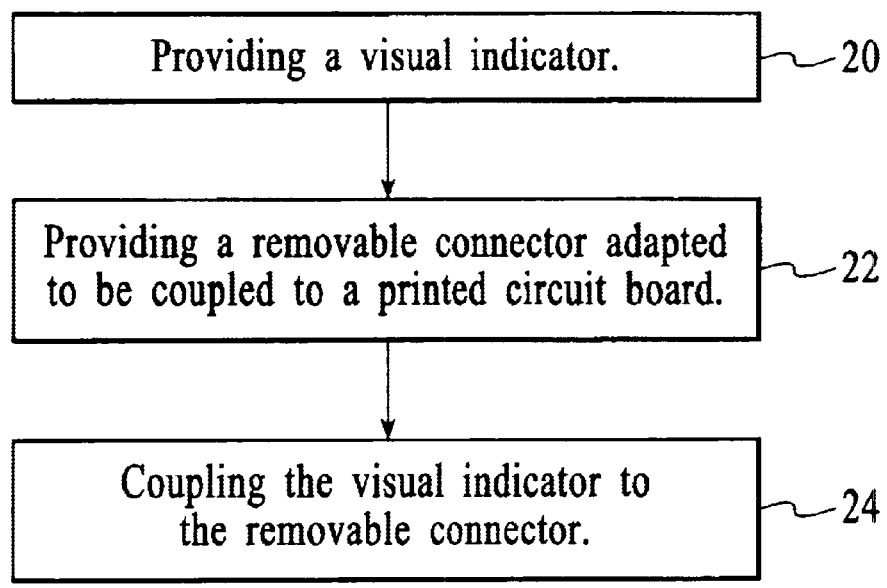
FIG. 3 is a flowchart of the method for fabricating a removable visual indication structure in accordance with the present invention.

For a further understanding of the present invention please refer now to FIG. 3. FIG. 3 is a flowchart of the method for fabricating the removable visual indication structure in accordance with the present invention. First, a visual indicator is provided, via step 20. Preferably the visual indicator is an LED type visual indicator. Next, a removable connector adapted to be coupled to a printed circuit board is provided, via step 22. This is preferably a surface mount type connector. Finally, the visual indicator is then coupled to the connector, via step 24. This is preferably accomplished by soldering the visual indicator to the back of the surface mount connector.

Although the preferred embodiment of the present invention utilizes soldering means to couple the visual indicator to the removable connector, one of ordinary skill in the art will readily recognize that a variety of coupling means could be utilized to couple the visual indicator to the removable connector while remaining within the spirit and scope of the present invention.

Figure 4A:
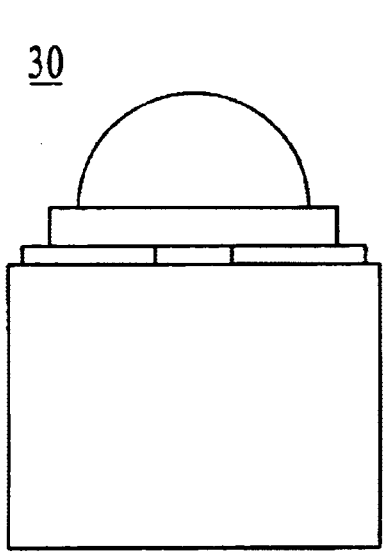
FIGS. 4(a–b) show an LED structure in accordance with the present invention.
Figure 4B:
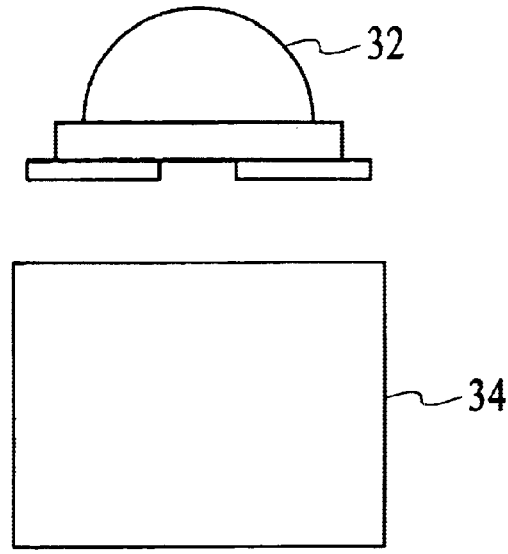
Figure 5A:
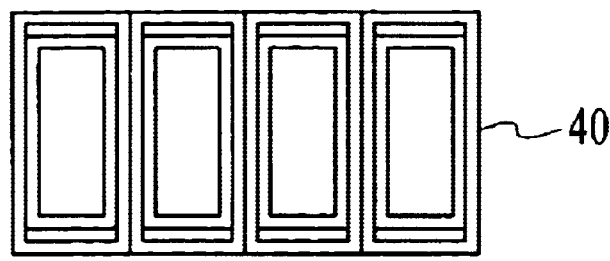
FIGS. 5(a–d) illustrate top, side, bottom and perspective views of the LED structure in accordance with the present invention.
Figure 5B:
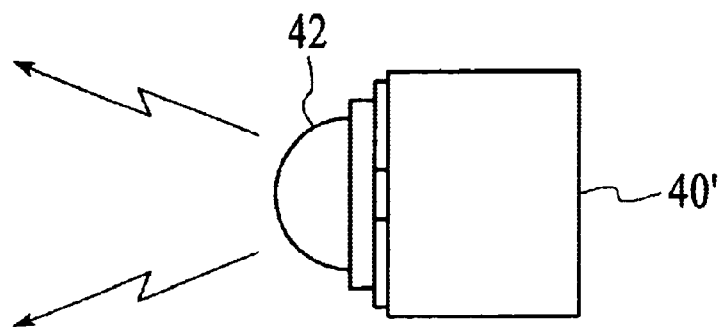
Figure 5C:
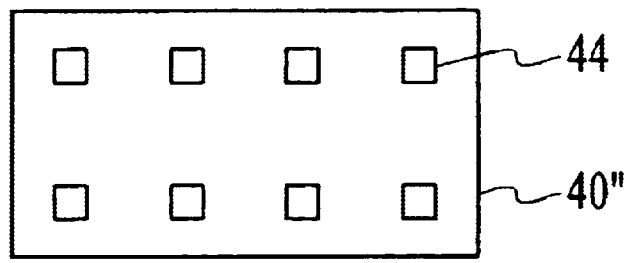
Figure 5D:
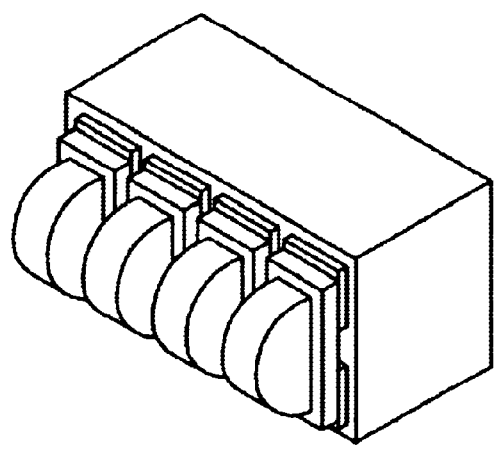

For a better understanding of the present invention please refer to FIGS. 4(a–b). FIG. 4(a) shows an LED structure 30 in accordance with the present invention. FIG. 4(b) shows the components of the LED structure 30 in accordance with the present invention. The structure 30 comprises an LED portion 32 and a removable connector portion 34. The LED portion 32 is preferably a surface mount LED and the removable connector portion 34 is preferably a surface mount connector. Accordingly, the LED portion 32 is coupled to the removable connector portion 34 thereby producing the LED structure 30.

Although the preferred embodiment of the present invention contemplates the utilization of an LED type visual indicator, one of ordinary skill in the art will readily recognize that a variety of visual indicators (incandescent lamps, neon lamps, etc.) could be implemented while remaining within the spirit and scope of the present invention.

For a more detailed description of the present invention please refer now to FIGS. 5(a–d). FIGS. 5(a–d) illustrate top, side, bottom and perspective views of the LED structure in accordance with the present invention. FIG. 5(a) is a top view of the surface mount connector 40. FIG. 5(b) shows a side view of a surface mount connector 40' wherein an LED 42 has been coupled thereto. FIG. 5(c) shows a bottom view of a surface mount connector 40". FIG. 5(c) illustrates sockets 44 wherein the surface mount connector 40" can be removably attached to a printed circuit board via a plurality of header pins located on the printed circuit board. Finally, FIG. 5(d) is a perspective view of the structure in accordance with the present invention.

Figure 6:
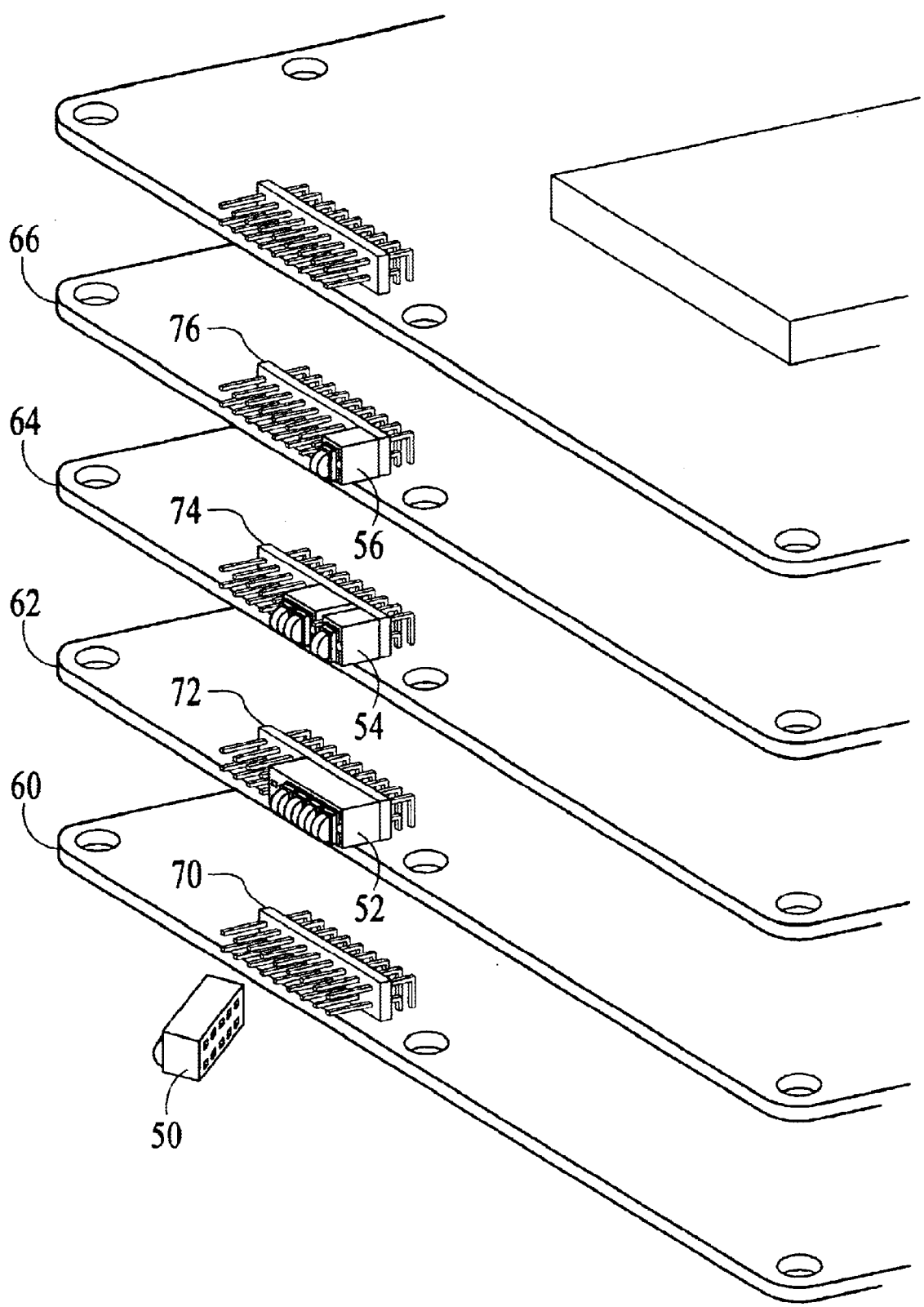
FIG. 6 illustrates a variety of different configurations of the LED structure in accordance with the present invention.

For an even further description of the present invention please refer to FIG. 6. FIG. 6 shows a variety of configurations wherein LED structures 50, 52, 54, 56 in accordance with the present invention are removably attached to printed circuit boards 60, 62, 64, 66 via pluralities of pins 70, 72, 74, 76. As can be seen in FIG. 5, the LED structures 50, 52, 54, 56 in accordance with the present invention are shown incorporating 1–4 LEDs. However, one of ordinary skill in the art will readily recognize than any number of LEDs can be incorporated while remaining within the spirit and scope of the present invention.

Because the LED structures 50, 52, 54, 56 include sockets, they can be easily removed. As a result, a printed circuit board employing an LED structure in accordance with the present invention only uses the space necessary for one plurality of header pins since the plurality of header pins can be used for the LED structure in accordance with the present invention and for a flat ribbon cable connector. Therefore, manufacturers needing to remotely place their own visual indicators can simply remove the LED structure and attach a flat ribbon cable connector or similar means onto the plurality of header pins.

Consequently, the printed circuit board space normal required for permanently attached LEDs is no longer needed for that purpose. As a result, the amount of available printed circuit board space is increased. This additional printed circuit board space can be subsequently utilized for adding more significant components (memory chips, interface chips, transistors, etc.). Although the present invention has been described in accordance with the embodiments shown, one of ordinary skill in the art will readily recognize that there could be variations to the embodiments and those variations would be within the spirit and scope of the present invention. For example, the present invention could be utilized with any type of system requiring visual indication and should not be limited to computer systems. Accordingly, many modifications may be made by one of ordinary skill in the art without departing from the spirit and scope of the appended claims.

What is claimed is:

1. A removable visual indication structure comprising:
   a removable connection portion adapted to be removably coupled to an electrical connector, the removable connection portion having a plurality of electrical contacts for contacting a plurality of electrical contacts of the electrical connector, the electrical connector being electrically coupled to a circuit of a printed circuit board, and wherein the electrical contacts of the removable connection portion are physically arranged in the same configuration as electrical contacts of a cable connector; and
   a visual indication portion wherein the visual indication portion is electrically coupled to the electrical contacts of the removable connection portion and is physically coupled, without a cable, to the removable connection portion,
   wherein the visual indication structure can be removably attached to the printed circuit board via the electrical connector and can be removed from the electrical connector and replaced on the electrical connector by the cable connector.

2. The removable visual indication structure of claim 1 wherein the visual indication portion comprises a Light Emitting Diode (LED).

3. The removable visual indication structure of claim 2 wherein the LED comprises a surface mount LED.

4. The removable visual indication structure of claim 3 wherein the removable connection portion comprises a surface mount connector.

5. The removable visual indication structure of claim 4 wherein the LED is soldered to the surface mount connector.

6. The removable visual indication structure of claim 1 wherein the electrical contacts of the removable connection portion are a plurality of sockets and the electrical contacts of the electrical connector are a plurality of pins, wherein the sockets receive the pins to establish electrical contact.

7. The removable visual indication structure of claim 6 wherein the LED is soldered to a socket-opposing side of the surface mount connector.

8. The removable visual indication structure of claim 6 wherein the sockets of the connection portion are provided in a surface mount connector.

9. The removable visual indication structure of claim 1 wherein the cable connector is a flat ribbon cable connector.

10. A removable visual indication structure for use with a printed circuit board comprising:
    a removable surface mount connector adapted to be removably attached to an electrical connector electrically coupled to the printed circuit board, the removable connector having a surface mount connection and at least one electrical socket for contacting at least one pin of the electrical connector, wherein the at least one socket receives the at least one pin to establish electrical contact; and
    at least one surface mount visual indicator coupled to the surface mount connection of the removable connector, wherein the visual indication structure can be removably attached to the printed circuit board and can be removed from the electrical connector.

11. The removable visual indication structure of claim 10 wherein the at least one visual indicator comprises an LED.

12. The removable visual indication structure of claim 11 wherein the LED is soldered to the surface mount connector.

13. The removable visual indication structure of claim 12 wherein the LED is soldered to the surface mount connection which is on a socket-opposing side of the surface mount connector.

14. A printed circuit board system comprising:

a printed circuit board;

an electrical connector electrically coupled to the printed circuit board, wherein the electrical connector includes at least one conductive electrical contact, and wherein the electrical connector is adapted to connect to a cable connector; and at least one removable visual indication structure adapted to removably connect to the at least one electrical contact of the electrical connector when the cable connector is not coupled to the electrical connector, wherein the at least one removable visual indication structure includes a visual indication portion and a removable connector, wherein the visual indication portion is coupled, without a cable, to the removable connector, wherein the visual indication structure can be removably attached to the printed circuit board by connecting the removable connector to at least one electrical contact of the electrical connector, and wherein the visual indication structure can be removed from the electrical connector and replaced on the electrical connector by the cable connector.

15. The system of claim 14 wherein the at least one visual indication portion comprises an LED.

16. The system of claim 15 wherein the LED comprises a surface mount LED.

17. The system of claim 16 wherein the removable connector comprises a surface mount connector.

18. The system of claim 17 wherein the LED is soldered to the surface mount connector.

19. The system of claim 14 wherein the cable connector is a flat ribbon cable connector.

20. The system of claim 14 wherein the at least one electrical contact of the electrical connector is at least one pin and the visual indication structure includes at least one socket for receiving the at least one pin of the electrical connector to establish electrical contact.

21. The system of claim 20 wherein the removable connector is a surface mount connector, and wherein the LED is soldered to a socket-opposing side of the surface mount connector.

22. The system of claim 14 wherein electrical contacts of the removable connector are physically arranged in the same configuration as electrical contacts of the cable connector.

23. A method for fabricating a removable visual indication structure for a printed circuit board comprising the steps of:

(a) providing at least one visual indicator;

(b) providing a removable connection portion adapted to be removably coupled to an electrical connector, the removable connection portion having a plurality of electrical contacts for contacting a plurality of electrical contacts of the electrical connector, the electrical connector being electrically coupled to the printed circuit board, and wherein the electrical contacts of the removable connection portion are physically arranged in the same configuration as electrical contacts of a cable connector; and (c) electrically coupling the at least one visual indicator to the electrical contacts of the removable connection portion and physically coupling, without a cable, the at least one visual indicator to the removable connection portion, wherein the visual indication structure can be removably attached to the printed circuit board via the electrical connector and can be removed from the electrical connector and replaced on the electrical connector by the cable connector.

24. The method of claim 23 wherein the at least one visual indicator comprises an LED.

25. The method of claim 24 wherein the LED comprises a surface mount LED.

26. The method of claim 25 wherein the removable connector comprises a surface mount connector.

27. The method of claim 26 wherein step (c) further comprises:

(c1) soldering the LED to the surface mount connector.

28. The method of claim 27 wherein the LED is soldered to the a side of the surface mount connector that opposes a connecting side of the surface mount connector that couples to the electrical connector.

29. The method of claim 23 wherein the electrical contacts of the connection portion are a plurality of sockets and the electrical contacts of the electrical connector are a plurality of pins, wherein the sockets receive the pins to establish electrical contact.

30. The method of claim 23 wherein the cable connector is a flat ribbon cable connector.

* * * * *